(12) United States Patent
Sakai

(10) Patent No.: US 7,226,795 B2
(45) Date of Patent: Jun. 5, 2007

(54) SEMICONDUCTOR-FERROELECTRIC STORAGE DEVICES AND PROCESSES FOR PRODUCING THE SAME

(75) Inventor: Shigeki Sakai, Ibaraki (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 81 days.

(21) Appl. No.: 10/525,045

(22) PCT Filed: Aug. 19, 2003

(86) PCT No.: PCT/JP03/10456

§ 371 (c)(1),
(2), (4) Date: Feb. 18, 2005

(87) PCT Pub. No.: WO2004/036651

PCT Pub. Date: Apr. 29, 2004

(65) Prior Publication Data

US 2006/0017120 A1 Jan. 26, 2006

(30) Foreign Application Priority Data

Aug. 20, 2002 (JP) ............................. 2002-238703
Mar. 18, 2003 (JP) ............................. 2003-074052
Aug. 7, 2003 (JP) ............................. 2003-288543

(51) Int. Cl.
*H01L 21/00* (2006.01)

(52) U.S. Cl. ........................................................ 438/3

(58) Field of Classification Search ................ 257/295; 118/715; 438/3
See application file for complete search history.

(56) References Cited

U.S. PATENT DOCUMENTS 6,060,755 A 5/2000 Ma et al.
(Continued)

FOREIGN PATENT DOCUMENTS

JP A-2001-291841 10/2001
(Continued)

OTHER PUBLICATIONS

Hag-Ju Cho, et al., "Structural and Electrical Properties of HfO$_2$ With Top Nitrogen Incorporated Layer", *IEEE Electron Device Letters*, vol. 23, No. 5, May 2002, pp. 249-251.

(Continued)

*Primary Examiner*—Carl Whitehead, Jr.
*Assistant Examiner*—Monica D. Harrison
(74) *Attorney, Agent, or Firm*—Morgan, Lewis & Bockius LLP (57) ABSTRACT

The MFIS transistors heretofore have a problem that after data writing, the data disappear in terms of memory transistor operation in about one day at most. This is mainly because the buffer layer and the ferroelectric have a high leakage current and, hence, charge is accumulated around the interface between the ferroelectric and the buffer layer so as to shield the electric polarization memorized by the ferroelectric, making it impossible for the electric polarization of the ferroelectric to control electrical conduction between the source and the drain in the transistor. In the present invention, by constituting an insulator buffer layer 2 of $HfO_{2+u}$ or $Hf_{1-x}Al_{2x}O_{2+x+y}$, the leakage current flowing through each of the insulator buffer layer 2 and a ferroelectric 3 can be reduced and a memory transistor having a truly sufficient long data holding time is realized.

22 Claims, 8 Drawing Sheets

U.S. PATENT DOCUMENTS

| | | | |
|---|---|---|---|
| 6,080,593 A | 6/2000 | Kim et al. | 438/3 |
| 6,207,589 B1 | 3/2001 | Ma et al. | 438/785 |
| 6,441,417 B1* | 8/2002 | Zhang et al. | 257/295 |
| 2003/0027360 A1 | 2/2003 | Hsu et al. | |
| 2004/0025787 A1* | 2/2004 | Selbrede et al. | 118/715 |

FOREIGN PATENT DOCUMENTS

JP    A-2002-353420    12/2002

OTHER PUBLICATIONS

Hoon Sang Choi, et al., "Electrical Characteristics of Pt/SrBi$_2$Ta$_2$O$_5$/Si Using Ta$_2$O$_5$ as the Buffer Layer", *2001 The Japan Society of Applied Physics*, Jpn. J. Appl. Phys. vol. 40 (2001), Part 1, No. 4B, Apr. 2001, pp. 2940-2942.

Kyu-Jeong Choi et al., "Metal/ferroelectric/insulator/semiconductor structure of Pt/Sr Bi$_2$ Ta$_2$ O$_8$/YMnO$_3$/Si using YMnO$_3$ as the buffer layer", *1999 American Institute of Physics*, Applied Physics Letters, vol. 75, No. 5, Aug. 2, 1999, pp. 722-724.

C. H. Choi, et al., "Thermally Stable CVD HfO$_x$N$_y$ Advanced Gate Dielectrics with Poly-Si Gate Electrode", *2002 IEEE*, IEDM, pp. 857-860.

S. Migita et al., "Epitaxial Structure SrBi$_2$Ta$_2$O$_9$<116>/ SrTiO$_3$<011> /Ce$_{0.12}$Zr$_{0.88}$<001>/Si<001> for Ferroelectric-Gate FET Memory," *Integrated Ferroelectrics*, vol. 40, pp. 2135-2143 (2001).

Shinji Migita et al., "Fabrication and Electrical Properties of Ferroelectric-gate FET with Epitaxial Gate Structure," *Denshi Jôhô Tūushin Gakkai Ronbun-shi*, vol. J85-C, No. 1 (Jan. 2002 issue), pp. 14-22.

* cited by examiner

SEMICONDUCTOR-FERROELECTRIC STORAGE DEVICES AND PROCESSES FOR PRODUCING THE SAME

TECHNICAL FIELD

The present invention relates to semiconductor-ferroelectric storage devices and processes for producing the same. More particularly, the present invention relates to semiconductor-ferroelectric storage devices employing as a memory cell a transistor comprising a ferroelectric film in a gate insulation film, and processes for producing the devices.

BACKGROUND ART

Transistors employing a ferroelectric as a gate insulation film are expected to be next-generation highly integrated memories because data storage, data readout, and writing are conducted in the individual transistors. In this kind of transistor, electrical conduction in the transistor is controlled according to the direction of electric polarization of the ferroelectric. Virtually, structures comprising an insulator buffer layer inserted between a semiconductor and a ferroelectric so as not to impair the features of both of the semiconductor and the ferroelectric have been investigated (see, for example, patent documents 1 and 2). Transistors of this structure including the metal gate electrode in contact with the ferroelectric are called MFIS (Metal-Ferroelectrics-Insulator-Semiconductor) transistors.

In principle, the MFIS transistors are expected to have the following features: (1) no data disappear even when the power is turned off, because electric polarization is utilized; (2) the only thing necessary for a readout operation is to check the electrical conduction between the source and the drain in the transistor, and the contents of the data remain undestroyed even after the readout operation; and (3) the speed of data readout and writing are as high as that of DRAMs.

However, the MFIS transistors heretofore have had a problem that after data writing, the data disappear in terms of memory transistor operation in about 1 day at most (see, for example, non-patent documents 1 and 2).

Patent Document 1: JP-A-2001-291841
Patent Document 2: JP-A-2002-353420
Non-Patent Document 1: S. Migita et al., *Integrated Ferroelectrics*, Vol. 40, pp. 135–143, 2001
Non-Patent Document 2: Shinji Migita et al., *Denshi Jôhô Tsûshin Gakkai Ronbun-shi*, Vol. J85-C, No. 1 (January 2002 issue), pp. 14–22

DISCLOSURE OF THE INVENTION

As described above, the MFIS transistors heretofore have failed to hold data over a period which enables practical use. This is mainly because the buffer layer and the ferroelectric have a high leakage current and, hence, charge is accumulated around the interface between the ferroelectric and the buffer layer, and this charge shields the electric polarization in the ferroelectric, making it impossible for the electric polarization of the ferroelectric to control electrical conduction between the source and drain in the transistor.

Furthermore, there is a problem that although a voltage is applied to the MFIS in data writing in the ferroelectric, most of the voltage acts on the buffer layer when the buffer layer has a low dielectric constant.

The problems of the related-art described above are to be solved by the present invention. An object thereof is to provide an MFIS type memory device capable of holding data over a period which enables practical use.

In order to accomplish the object described above, the present invention provides a semiconductor-ferroelectric storage device, which comprises a transistor comprising a semiconductor substrate or semiconductor region having a source region and a drain region and, on which an insulator buffer layer, a ferroelectric film, and a gate electrode are layered in this order, wherein the insulator buffer layer is an insulating film comprising a hafnium-aluminum oxide as a main component.

Preferably, x indicating the constitution ratio, $Hf_{1-x}:Al_{2x}$, between said hafnium element and said aluminum element in the insulator buffer layer is within a ratio of $0<x<0.7$.

More preferably, the insulator buffer layer contains a nitrogen element as an additive.

In order to accomplish the object, the present invention further provides a semiconductor-ferroelectric storage device, which comprises a transistor comprising a semiconductor substrate or semiconductor region having a source region and a drain region and, on which an insulator buffer layer, a ferroelectric film, and a gate electrode are layered in this order, wherein the insulator buffer layer is an insulating film comprising a hafnium oxide as a main component and contains a nitrogen element as an additive.

Preferably, the nitrogen element is contained in an amount of from $1\times10^{19}$ cm$^{-3}$ to $1\times10^{22}$ cm$^{-3}$.

More preferably, an oxide film, a nitride film, or an oxynitride film is inserted between the semiconductor substrate and the insulator buffer layer.

In order to accomplish the object, the present invention furthermore provides a process for producing a semiconductor-ferroelectric storage device, which comprises a transistor comprising a semiconductor substrate or semiconductor region having a source region and a drain region and, on which an insulator buffer layer comprising a hafnium-aluminum oxide as the main component, a ferroelectric film, and a gate electrode are layered in this order, said process comprising a treatment of a semiconductor surface, a formation of the insulator buffer layer, a formation of the ferroelectric film, a formation of the gate electrode, and a heat treatment.

Preferably, the formation of the insulator buffer layer is conducted in an atmosphere comprising nitrogen gas.

In order to accomplish the object, the invention still further provides a process for producing a semiconductor-ferroelectric storage device, which comprises a transistor comprising a semiconductor substrate or semiconductor region having a source region and a drain region and, on which an insulator buffer layer comprising a hafnium oxide as a main component, a ferroelectric film, and a gate electrode are layered in this order, said process comprising a treatment of a semiconductor surface, a formation of the insulator buffer layer, a formation of the ferroelectric film, a formation of the gate electrode, and a heat treatment, wherein the formation of the insulator buffer layer being conducted in an atmosphere comprising nitrogen gas.

Preferably, the atmosphere comprising nitrogen gas is a mixed-gas atmosphere comprising nitrogen and oxygen in a molar ratio of from 1:1 to 1:10$^{-7}$.

More preferably, a heat treatment is conducted at least one time in any timing and environment selected from: in a vacuum vessel for ferroelectric-film formation during the formation of the ferroelectric film; in a vacuum vessel for ferroelectric-film formation after the formation of the ferroelectric film; in an annealing furnace after the formation of the ferroelectric film and before the formation of the gate electrode; and in an annealing furnace after the formation of the gate electrode.

According to the present invention, data writing and readout can be realized in a one-transistor size, and the data which has been written never disappear over a practically sufficient prolonged period of time. In addition, the contents of the data remain undestroyed even after readout. The devices according to the present invention can be used in a variety of circuits, not only as semiconductor memories for a wide range of applications but also as stable temporary storage devices in semiconductor logic circuits.

BEST MODE FOR CARRYING OUT THE INVENTION

Figure 1:
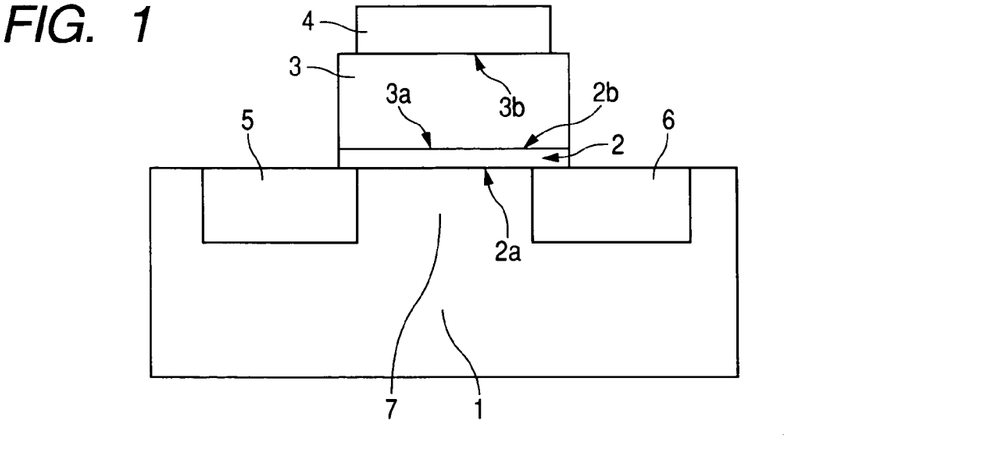
FIG. 1 is an overview illustrating a transistor according to the present invention.

FIG. 1 is an overview of a semiconductor-ferroelectric storage device according to the present invention. For producing the device according to the present invention, a semiconductor substrate 1 is prepared first. This semiconductor substrate 1 may be silicon, germanium or silicon/germanium mixed crystal or may be SiC or GaAs, and the kind thereof is not limited. It is also possible to use an SOI (silicon on insulator) substrate in place of the semiconductor substrate.

One side 2a of an insulator buffer layer 2 is connected to one side of the semiconductor substrate 1. As the insulator buffer layer 2 is formed an oxide $HfO_{2+u}$, which contains hafnium as a constituent element, or an oxide $Hf_{1-x}Al_{2x}O_{2+x+y}$, which contains hafnium and aluminum as constituent elements. It is especially preferable that the range of x is $0<x<0.7$ from the standpoints of enhancing thermal stability and chemical stability and of having a high dielectric constant. It is especially preferable that the range of y is $-0.2<y<0.2$ from the standpoint of showing good insulating properties. It is also especially preferable that the range of u is $-0.2<u<0.2$ from the standpoint of showing good insulating properties. It is especially preferable that the thickness t of each of the $HfO_{2+u}$ and $Hf_{1-x}Al_{2x}O_{2+x+y}$ is in the range of 4 nm<t<40 nm from the standpoint of reducing the absolute value of the applied voltage for data writing, i.e., for determining the state of electric polarization.

One side 3a of a ferroelectric film 3 is connected to the other side 2b of the insulator buffer layer 2. Although the kind of the ferroelectric is not limited, typical examples thereof include $SrBi_2Ta_2O_9$, $SrBi_2(Ta_{1-z}Nb_z)_2O_9$, $Bi_4Ti_3O_{12}$, $Bi_{4-z}La_zTi_3O_{12}$, $PbZr_{1-z}Ti_zO_3$, and $YMnO_3$. It is especially preferable that the thickness d of the ferroelectric film is in the range of 20 nm<d<600 nm from the standpoint of reducing the absolute value of the applied voltage for data writing, i.e., for determining the state of electric polarization.

A gate electrode 4 is connected to the other side 3b of the ferroelectric film 3. The gate electrode 4 may be any material having good electrical conductivity. For example, it may be a metal such as gold or platinum, a nitride such as TiN or TaN, or an oxide such as $IrO_2$ or $RuO_2$. Furthermore, the gate electrode 4 may be a multilayered film such as Pt/TiN/Ti or $IrO_2$/Ir.

The semiconductor substrate 1 has a source region 5 and a drain region 6. In the case where the source region 5 and the drain 6 are n-type, the region 7 other than the source region 5 and drain region 6 is p-type. In the case where the source region 5 and drain region 6 in the semiconductor substrate 1 are p-type, the region 7 other than the source region 5 and drain region 6 is n-type.

Effects

Data storage is based on the electric polarization of the ferroelectric film 3. In order to have ferroelectricity, the ferroelectric film 3 should be heated to a high temperature, during the thin-film formation or in a subsequent heat treatment, to thereby bring the film 3 into a crystalline state. This crystallization temperature is generally from 650° C. to 950° C. In general, the higher the temperature, the better the crystallinity and ferroelectricity. The period of the crystallization step is typically 1 hour. For forming a source region and a drain region in the silicon, a short-time (typically 30 seconds) heat treatment at a temperature of at least about 1050° C. is necessary for activation of the impurities. The insulator buffer layer 2 inevitably undergoes this high-temperature step for crystallizing the ferroelectric film 3. In a standard production process, the buffer layer 2 further undergoes a heat treatment step for forming a source region and a drain region. Accordingly, in processes heretofore, the insulator buffer layer 2 is also disadvantageously crystallized in the heat treatment step and this has resulted in leakage current flowing through grain boundaries between crystal grains. In the case of the $HfO_{2+u}$ or $Hf_{1-x}Al_{2x}O_{2+x+y}$ in this embodiment, the insulator buffer layer 2 is not crystallized but retains the amorphous state even in the thermal step for ferroelectric crystallization or in the thermal step for activation of the impurities. Consequently, the insulator buffer layer 2 can have a reduced leakage current. The surface of the insulator buffer layer 2 in an amorphous state is smoother than the insulator buffer layer which has been crystallized. Seed crystals for the growth of crystals of a ferroelectric film 3 are less apt to generate from the surface of the amorphous insulator buffer layer 2. Accordingly, crystal grains of ferroelectric film 3 can be small, dense thin film can be formed, and the leakage current flowing through the ferroelectric film 3 can be reduced. On the other hand, when the insulator buffer layer 2 is crystallized, this layer has enhanced surface irregularities due to the crystal grains and grain boundaries. These crystal grains are apt to generate seed crystals for a ferroelectric film 3, and the resultant ferroelectric film 3 is constituted of large crystal grains and has an increased leakage current. As described above, by constituting an insulator buffer layer 2 of $HfO_{2+u}$ or $Hf_{1-x}Al_{2x}O_{2+x+y}$, the leakage current flowing through each of the insulator buffer layer 2 and the ferroelectric film 3 can be reduced and a memory transistor having a truly sufficient long data holding time is realized. $Hf_{1-x}Al_{2x}O_{2+x+y}$ retains its amorphous state at even higher temperatures than $HfO_{2+u}$ in a heat treatment step and, hence, is especially preferred when a ferroelectric having a high crystallization temperature is used as the ferroelectric film 3.

Production Processes

Production processes are explained next. It is a matter of course that the production processes of the present invention should not be construed as being limited to the following processes.

For forming the insulator buffer layer 2, any technique for thin-film formation can be used. Effective techniques for physical vapor deposition include pulsed-laser deposition (also called laser ablation), sputtering, and vapor deposition. Examples of chemical deposition include MOCVD (metal organic chemical vapor deposition), MOD (metal organic decomposition), and a sol-gel method.

For forming the ferroelectric film 3 and the gate electrode 4 also, any technique for thin-film formation can be used. Effective techniques for physical vapor deposition include pulsed-laser deposition, sputtering, and vapor deposition. Examples of chemical deposition include MOCVD, MOD, and a sol-gel method.

An example of production processes is explained below in which silicon is used as a semiconductor substrate 1 and pulsed-laser deposition is used for forming an insulator buffer layer 2 and a ferroelectric film 3.

1. Treatment of Silicon Surface

A silicon surface is cleaned by a standard surface-cleaning method. Thereafter, the oxide layer remaining on the surface is removed with dilute hydrofluoric acid or buffered hydrofluoric acid. Furthermore, a surface treatment for, e.g., purposely forming an oxide film, nitride film, or oxynitride film composed of from one to several molecular layers may be conducted.

2. Formation of Insulator Buffer Layer 2

The layer is formed by pulsed-laser deposition. For the purpose of inhibiting the formation of an oxide layer having a low permittivity, such as $SiO_2$, the temperature of the silicon during layer formation is kept low (from room temperature to 550° C.). When the insulator buffer layer 2 is an oxide containing hafnium and aluminum as constituent elements, a target composition of $Hf_{1-x}Al_{2x}O_{2+x+y}$ is used. Alternatively, $HfO_{2+u}$ and $Al_2O_3$ may be used. In this case, although the two targets may be simultaneously vaporized (sputtered), use may be made of a method in which the two targets are each alternately vaporized one or more times to synthesize $Hf_{1-x}Al_{2x}O_{2+x+y}$ through a heat treatment. When $HfO_{2+u}$ and $Al_2O_3$ are alternately deposited, it is especially preferred to deposit $HfO_{2+u}$ first. When the insulator buffer layer 2 is an oxide containing hafnium as a constituent element, a target composition of $HfO_{2+u}$ is used. Since the insulator buffer layer 2 is an oxide, oxygen gas is introduced during formation. It is especially preferred to mix oxygen gas with nitrogen gas for the purpose of inhibiting and diminishing the formation of an oxide layer having a low-permittivity at the interface between the silicon and the insulator buffer layer 2. Nitrogen can also diminish structural defects in the insulator buffer layer 2 and reduce leakage current. When an oxygen/nitrogen mixed gas is used, the N:O mixing molar ratio is from 1:1 to $1:10^{-7}$. Furthermore, since the $Hf_{1-x}Al_{2x}O_{2+x+y}$ and $HfO_{2+u}$ targets themselves contain oxygen and because hafnium atoms and aluminum atoms readily form oxides, nitrogen gas only may be introduced during the formation of an insulator buffer layer 2. In this case, the mixing molar ratio is determined by the amount of residual oxygen contained in the nitrogen gas. Although the mixing molar ratio between nitrogen and residual oxygen, N:O, is typically from $1:10^{-5}$ to $1:10^{-7}$, the molar ratio of oxygen gas to nitrogen gas may be smaller than that.

As a result of the film formation in an atmosphere comprising nitrogen gas, a nitrogen element is added as an additive to the insulator buffer layer. Thus the effects described above can be provided. The content of the nitrogen element is preferably in a range of from $1\times10^{19}$ cm$^{-3}$ to $1\times10^{22}$ cm$^{-3}$. It is especially preferable that the range thereof is from $5\times10^{19}$ cm$^{-3}$ to $5\times10^{21}$ cm$^{-3}$.

3. Formation of Ferroelectric Film 3

The film is formed by pulsed-laser deposition. Use may be made of a method in which silicon as a semiconductor substrate 1 is placed in the same vacuum vessel for thin-film formation as in the formation of the insulator layer 2 described above, and an insulator buffer layer 2 and a ferroelectric film 3 are successively formed by pulsed-laser deposition without taking the silicon out of the vessel. This method is especially preferred because the interface between the insulator buffer layer 2 and the ferroelectric film 3 is kept clean and excellent electrical properties are obtained. During the formation of the ferroelectric film 3, oxygen gas is introduced.

4. Formation of Gate Electrode

In the case of platinum, for example, a platinum gate electrode is formed by vapor deposition with electron beam heating, by sputtering or pulsed-laser deposition.

5. Heat Treatment Step

A heat treatment is conducted for crystallizing the ferroelectric film 3. There are the following four cases of heat treatment timing, and at least one of these cases is carried out.

(1) Heat treatment during the thin-film formation in step 3 described above. (2) Heat treatment in the vacuum vessel for thin-film formation after the thin-film formation in step 3 described above. (3) Heat treatment in an annealing furnace after the thin-film formation in step 3 and before step 4. (4) Heat treatment in an annealing furnace after step 4.

When the ferroelectric film 3 is $SrBi_2Ta_2O_9$, the heat treatment temperature for crystallization is from 650° C. to 900° C.

In this heat treatment step for crystallization, when an oxygen is suppled to the surface of the silicon substrate, there are cases where a silicon oxide film may grow at the interface between the substrate and the insulator buffer layer or at the interface between the substrate and a surface treatment film, e.g., an oxide film. According to the invention, since a nitrogen element is added to the insulator buffer layer, oxygen movement is inhibited and, hence, the growth of a silicon oxide film is inhibited. Simultaneously, it is expected that the ferroelectric film is inhibited from being reduced by the heat treatment.

EXAMPLE 1

The materials used and the thicknesses thereof are as follows.
Semiconductor substrate 1: Si
Insulator buffer layer 2: $Hf_{1-x}Al_{2x}O_{2+x+y}$; x=0.25; y=0; thickness of 10 nm
Ferroelectric film 3: $SrBi_2Ta_2O_9$; thickness of 400 nm
Gate electrode 4: Pt; thickness of 200 nm; gate length (length of distance from source region to drain region) of 10 μm
Conductivity type of source region 5 and drain region 6: n-type
Conductivity type of region 7: p-type
$Hf_{1-x}Al_{2x}O_{2+x+y}$ (x=0.25; y=0) as an insulator buffer layer 2 was formed by pulsed-laser deposition. The laser used was a KrF excimer laser. The laser energy was 250 mJ per pulse, the pulse repetition frequency was 2 Hz, and the deposition time was 270 seconds. The temperature of the substrate was 200° C. The introduction gas was a nitrogen/oxygen mixed gas, in which the molar ratio N:O was $1:10^{-6}$. The pressure of this introduction gas in the deposition chamber was 0.1 Torr (13.33 Pa). $SrBi_2Ta_2O_9$ corresponding to a ferroelectric film 3 was also formed by pulsed-laser deposition. The kind and energy of the laser were the same as in the case of the insulator buffer layer 2 described above. The pulse repetition frequency was 5 Hz and the deposition time was 34 minutes. The temperature of the substrate was 400° C. The introduction gas was oxygen. The pressure of this introduction gas in the deposition chamber was 0.1 Torr (13.33 Pa). Platinum was formed as a gate electrode 4 by electron-beam vacuum deposition. After the formation of the gate electrode, a heat treatment was conducted at 800° C. in oxygen at atmospheric pressure for 1 hour in order to crystallize the $SrBi_2Ta_2O_9$. A transistor was produced by using techniques for use in semiconductor device production steps, such as photolithography and ion beam etching.

Figure 2:
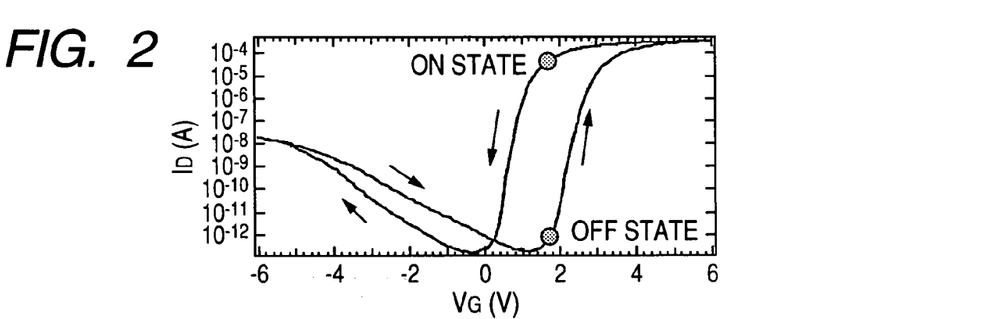
FIG. 2 is a drawing showing the relationship between gate voltage and drain current in Example 1.
Figure 3:
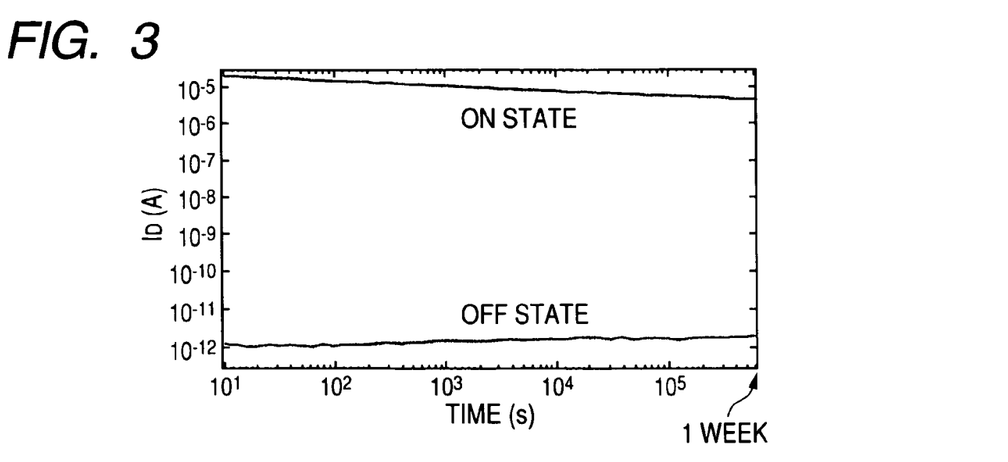
FIG. 3 is a drawing showing changes of drain current with time in the transistor according to Example 1.

Properties of the transistor produced in Example 1 above are then shown. FIG. 2 shows the results of a drain current $I_D$ when a gate voltage $V_G$ was applied to the gate electrode 4. The gate voltage was continuously changed from 6 V to −6 V and then changed from −6 V to 6 V. The drain current changed as shown in FIG. 2 according to the specific properties of the ferroelectric. With the sweep of gate voltage, the drain current changed as shown by the arrows. The transistor can come into either of two states, i.e., an ON state and an OFF state, according to the direction of electric polarization memorized as represented by the two points shown in FIG. 2. FIG. 3 shows the result that the gate voltage was fixed at the two points and the drain current was measured over a prolonged period of time with respect to each of the ON state and OFF state. It can be seen from FIG. 3 that the two states continue extremely stably.

EXAMPLE 2

The materials used and the thicknesses thereof are as follows.
Semiconductor substrate 1: Si
Insulator buffer layer 2: $HfO_{2+u}$; u=0; thickness of 10 nm
Ferroelectric film 3: $SrBi_2Ta_2O_9$; thickness of 400 nm
Gate electrode 4: Pt; thickness of 200 nm; gate length (length of distance from source region to drain region) of 10 μm
Conductivity type of source region 5 and drain region 6: n-type
Conductivity type of region 7: p-type
$HfO_{2+u}$ (u=0) as an insulator buffer layer 2 was formed by pulsed-laser deposition. The laser used was a KrF excimer laser. The laser energy was 250 mJ per pulse, the pulse repetition frequency was 2 Hz, and the deposition time was 270 seconds. The temperature of the substrate was 200° C. The introduction gas was a nitrogen/oxygen mixed gas, in which the molar ratio N:O was $1:10^{-6}$. The pressure of this introduction gas in the deposition chamber was 0.1 Torr (13.33 Pa). $SrBi_2Ta_2O_9$ corresponding to a ferroelectric film 3 was also formed by pulsed-laser deposition. The kind and energy of the laser were the same as in the case of the insulator buffer layer 2 described above. The pulse repetition frequency was 5 Hz and the deposition time was 34 minutes. The temperature of the substrate was 400° C. The introduction gas was oxygen. The pressure of this introduction gas in the deposition chamber was 0.1 Torr (13.33 Pa). Platinum was formed as a gate electrode 4 by electron-beam vacuum deposition. After the formation of the gate electrode, a heat treatment was conducted at 800° C. in oxygen atmospheric pressure for 1 hour in order to crystallize the $SrBi_2Ta_2O_9$.

Figure 4:
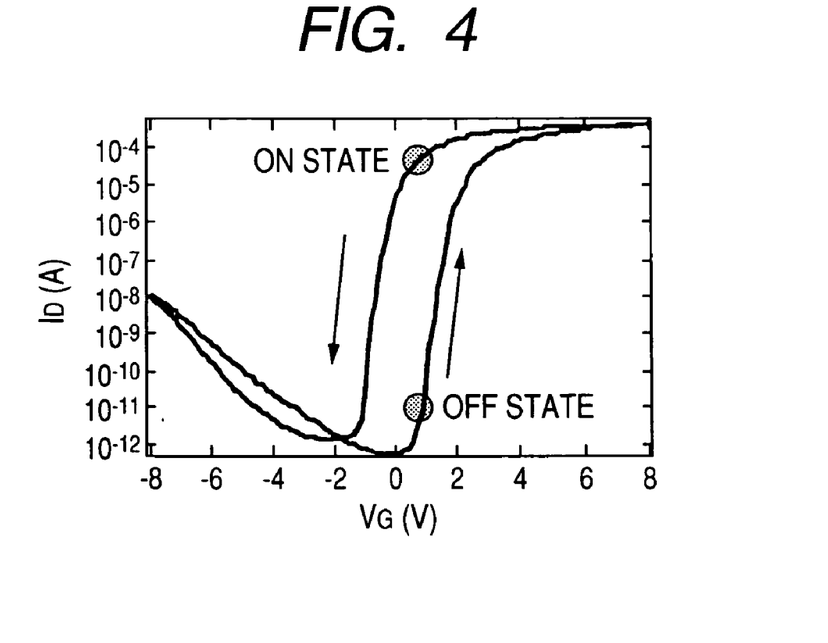
FIG. 4 is a drawing showing the relationship between gate voltage and drain current in Example 2.
Figure 5:
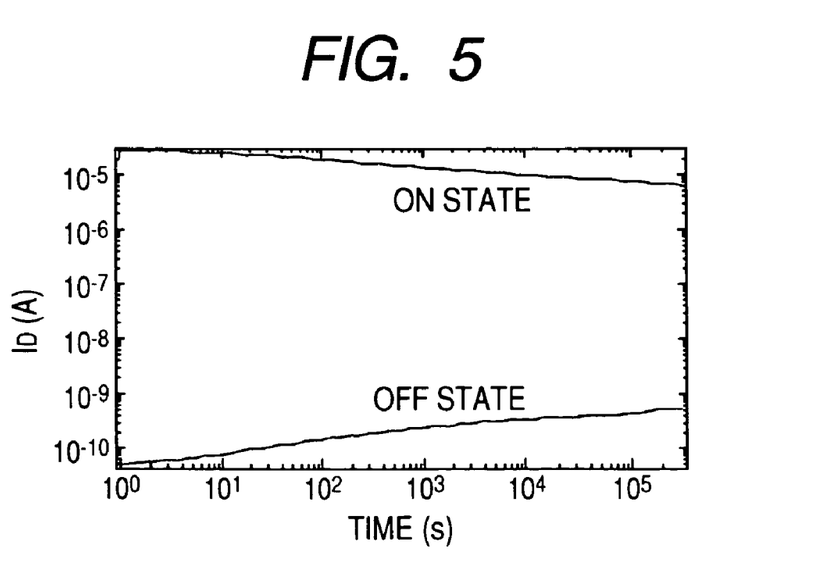
FIG. 5 is a drawing showing changes of drain current with time in the transistor according to Example 2.

The results of experiments of the transistor produced in Example 2 above are then shown. FIG. 4 shows the results of a drain current $I_D$ when a gate voltage $V_G$ was applied to the gate electrode 4. The gate voltage was continuously changed from 8 V to −8 V and then changed from −8 V to 8 V. The drain current changed as shown in FIG. 4 according to the specific properties of the ferroelectric. With the sweep of gate voltage, the drain current changed as shown by the arrows. The transistor can come into either of two states, i.e., an ON state and an OFF state, according to the direction of electric polarization memorized as represented by the two points shown in FIG. 4. FIG. 5 shows the result that the gate voltage was fixed at the two points and the drain current was measured over a prolonged period of time with respect to each of the ON state and OFF state. It can be seen from FIG. 5 that the two states continue extremely stably.

Figure 6:
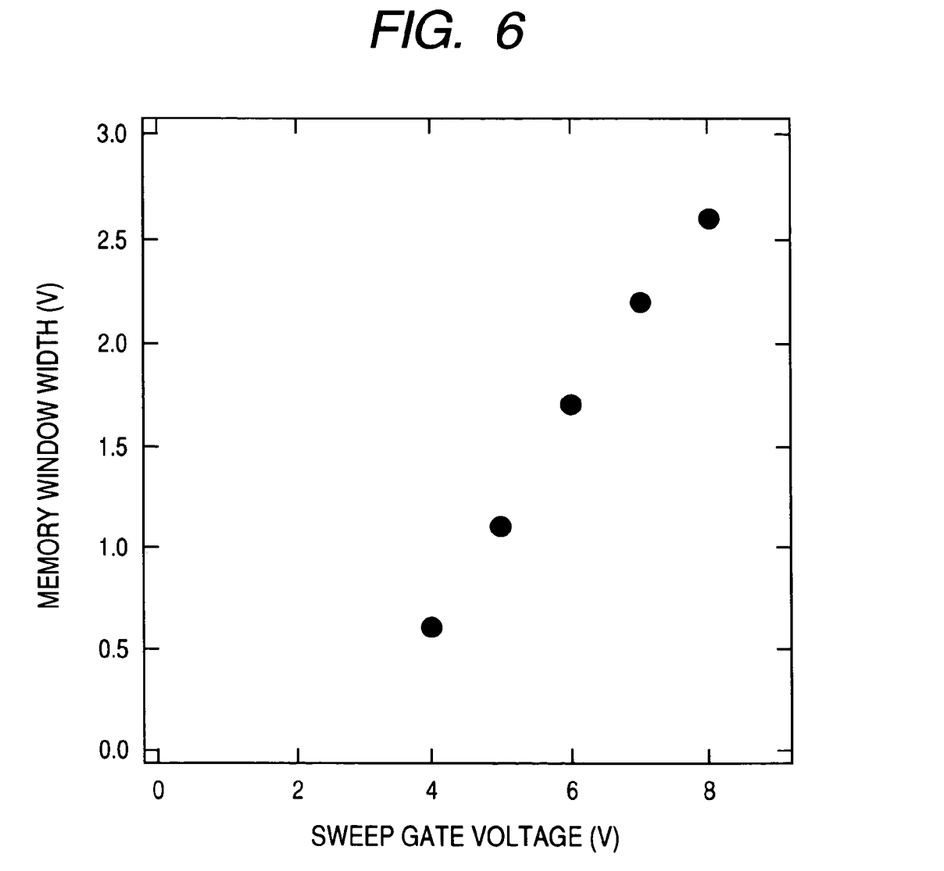
FIG. 6 is a drawing showing the relationship between sweep gate voltage and memory window width in Example 1.

In FIG. 2, the curve in the range of $0<V_G<3$ V including the point shown by "ON STATE" and the curve in the range of $1.6\ V<V_G<4.6$ V including the point shown by "OFF STATE" have an almost parallel-shifting relationship with each other. The voltage corresponding to the width of this shifting is called memory window width. This memory window width gives one index to the memory characteristics of MFIS transistors. Too small values of the memory window width result in too small widths of set voltage, while too large values thereof result in an increased gate voltage for data writing. In FIG. 2, the gate voltage was changed over the range of ±6 V. The memory window width when the width of the gate voltage (sweep voltage) for Example 1 was changed is summarized in FIG. 6.

Figure 7:
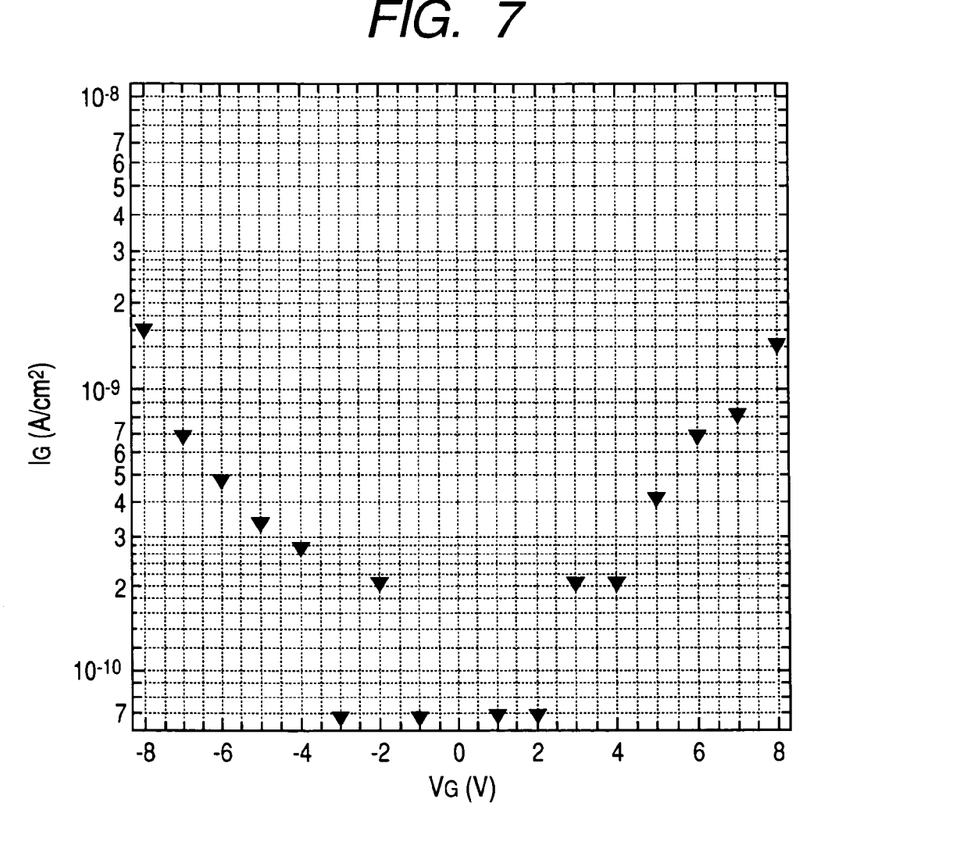
FIG. 7 is a drawing showing the relationship between gate voltage and gate leakage current in Example 1.

The source electrode, drain electrode, and substrate were made to have the same potential and the potential of the gate electrode was regulated so as to be higher than that by $V_G$. Under these conditions, the current $I_G$ flowing through the insulator buffer layer and ferroelectric film arranged serially was measured. FIG. 7 shows the results of the measurement in Example 1. $I_G$ corresponds to the leakage current in the insulator buffer layer and ferroelectric film arranged serially. When $V_G \leq \pm 6$ V, then $I_G$ is $5\times10^{-10}$ $A/cm^2$ or lower. These values of leakage current are far lower than the values $1\times10^{-8}$ A/cm$^2$ or lower for the same voltage range which are shown in FIG. 9(b) at page 20 of non-patent document 2.

Figure 8:
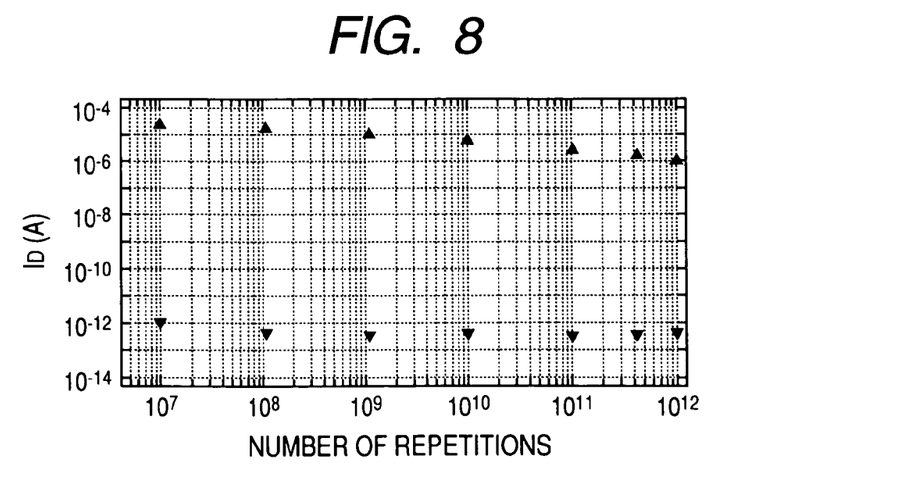
FIG. 8 is a drawing showing the relationship between the number of rewriting operations and drain current in Example 1.

A test for determining the number of data rewriting operations was conducted. A voltage of +8 V was applied to the gate electrode for 500 ns to thereby form an ON state, and a voltage of −8 V was then applied for 500 ns to thereby form an OFF state. This operation as one cycle was repeated $10^{12}$ times. FIG. 8 shows the test results for Example 1. It can be seen from FIG. 8 that even after the $10^{12}$ repetitions (i.e., $2\times10^{12}$ data-rewriting operations), the ON-state drain current can be discriminated from the OFF-state drain current without any problem.

Figure 9:
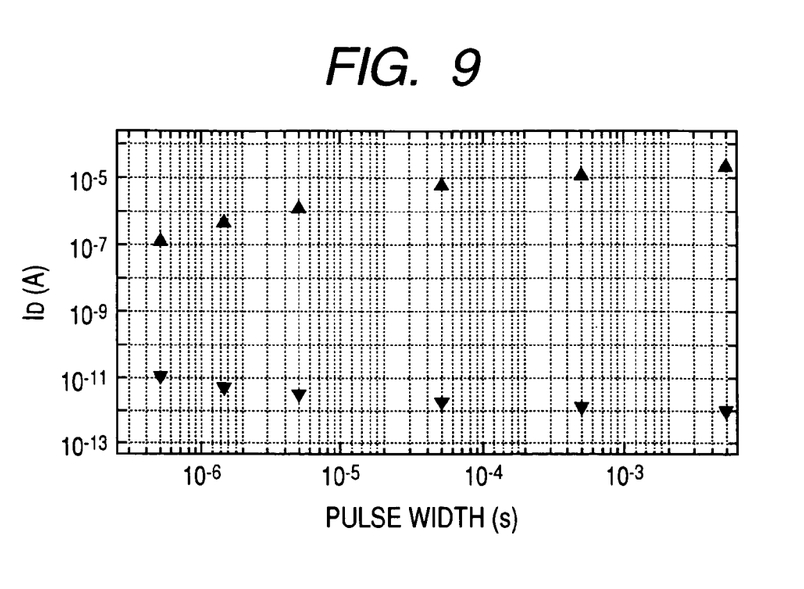
FIG. 9 is a drawing showing the relationship between gate voltage pulse width and drain current in Example 1.

A test for determining dependence on writing pulse width was conducted. A single-pulse voltage having a pulse height of +8 V or −8 V was applied to the gate electrode to form an ON state or OFF state, while changing the width of the pulse. After this writing pulse application, a drain voltage of 0.1 V was applied to measure the drain current. The test results for Example 1 are shown in FIG. 9. It can be seen from FIG. 9 that even after the application of a pulse having a width of 500 ns, the ON-state drain current was higher than the OFF-state drain current by at least 4 digits.

A sample for Example 1 was analyzed for elemental composition by secondary ion mass spectrometry. The sample was dug from the back side of the silicon substrate in the order of silicon/insulator buffer layer/ferroelectric film, and each component was analyzed for elements. As a result, the insulator buffer layer was ascertained to contain nitrogen atoms as an additive. The amount thereof was $2\times10^{20}$ cm$^{-3}$. As stated above, the presence of these atoms not only serves to diminish structural defects in the insulator buffer layer to thereby reduce leakage current, but also serves to inhibit the formation of an oxide layer having a low-permittivity at the interface between the silicon and the insulator buffer layer.

Figure 10:
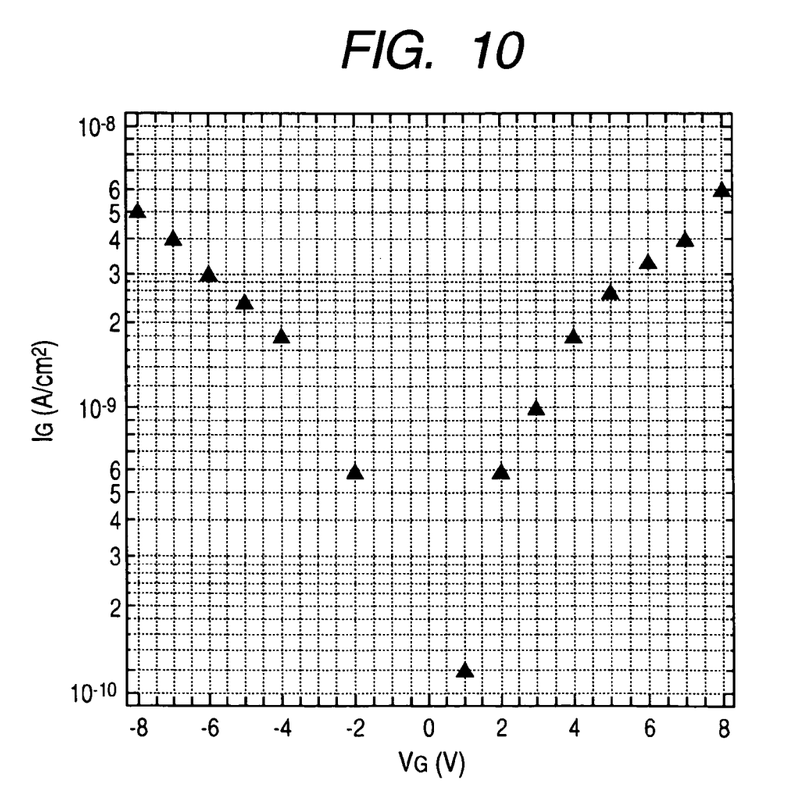
FIG. 10 is a drawing showing the relationship between gate voltage and gate leakage current in Example 2.

In the case of Example 2 also, voltages were applied to the gate electrode in the same manner as that shown in FIG. 7 and the resultant leakage current $I_G$ was measured. The results of this test are shown in FIG. 10. In this Example also, the leakage current was lower than in the Example given in FIG. 9(b) at page 20 of non-patent document 2.

A sample for Example 2 also was analyzed by secondary ion mass spectrometry. The method used was the same as in Example 1 described above. As a result, the insulator buffer layer was ascertained to contain nitrogen atoms as an additive. The amount thereof was $2\times10^{20}$ cm$^{-3}$. Same as in Example 1, the presence of these atoms serves to reduce leakage current and to inhibit the formation of an oxide layer having a low-permittivity at the interface between the silicon and the buffer layer.

EXAMPLES 3 TO 7 AND REFERENCE EXAMPLE

Figure 11:
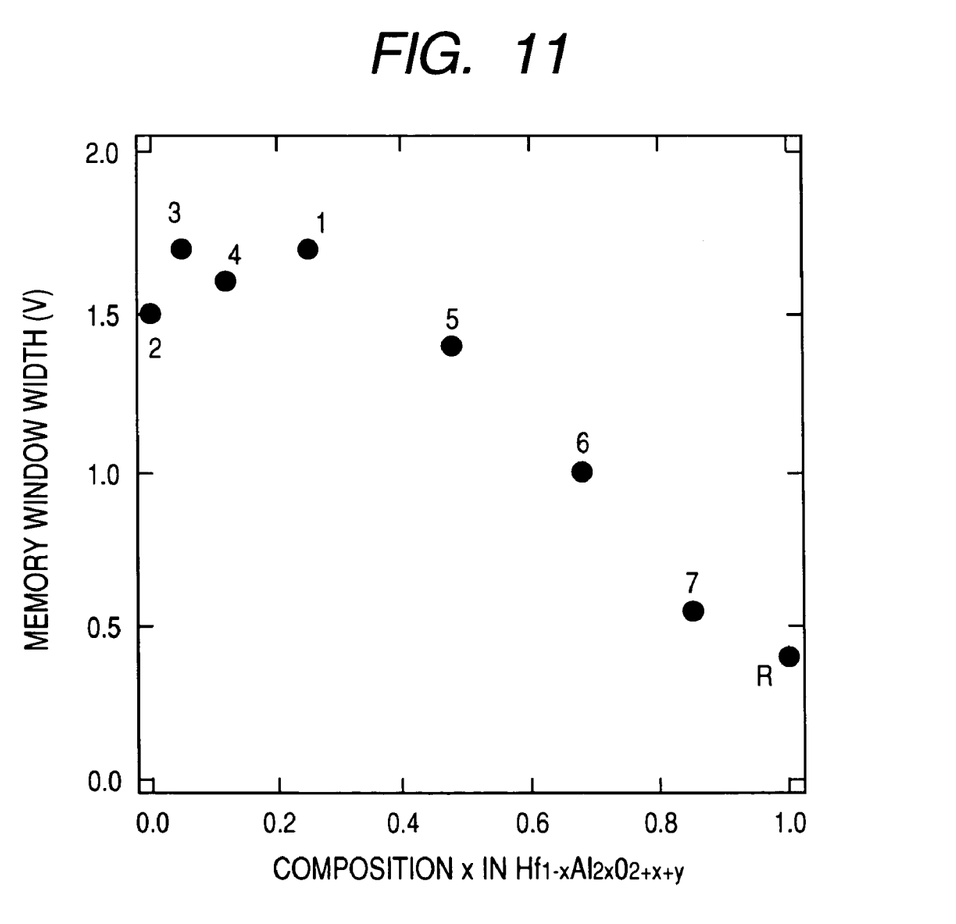
FIG. 11 is a drawing showing the relationship between the composition x in $Hf_{1-x}Al_{2x}O_{2+x+y}$ and memory window width in Examples 1 to 7.
Figure 12:
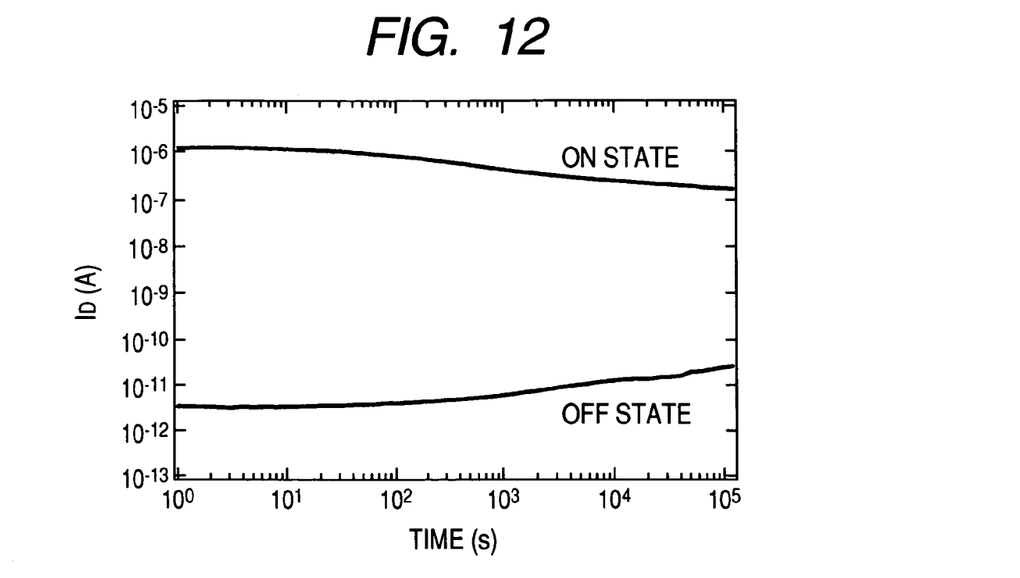
FIG. 12 is a drawing showing changes of drain current with time in the transistor according to Example 5.

Transistors of Examples 3 to 7 were produced under completely the same conditions as in Example 1 and Example 2, except for the composition x in the insulator buffer layer. The values of x were: x=0.05 in Example 3, x=0.12 in Example 4, x=0.48 in Example 5, x=0.68 in Example 6, and x=0.85 in Example 7. Furthermore, a transistor employing a material in which x=1, i.e., Al$_2$O$_3$, as an insulator buffer layer was also produced as Reference Example. The gate voltage was swept and the drain current was measured to determine the memory window width of the MFIS transistor. The sweep gate voltage was conducted under the same conditions of ±6 V. The results thereof are shown in FIG. 11 together with the results in Example 1 and Example 2. The numerals in FIG. 11 correspond to the Example numbers. R in FIG. 11 indicates Reference Example. When x is equal to 0 or is in the range of from above 0 to below 0.7, memory window widths of 1 V or larger were obtained. A gate voltage $V_G$ of 7 V was applied to the transistor of Example 5 and the $V_G$ was then returned to 0.95 V to form an ON state. This state in which $V_G$=0.95 V was maintained and the drain current in the ON state was measured as a function of time. Furthermore, a gate voltage $V_G$ of −7 V was applied thereto and the $V_G$ was then returned to 0.95 V to form an OFF state. This state in which $V_G$=0.95 V was maintained and the drain current in the OFF state was measured as a function of time. The results of those are shown in FIG. 12.

EXAMPLE 8

Figure 13:
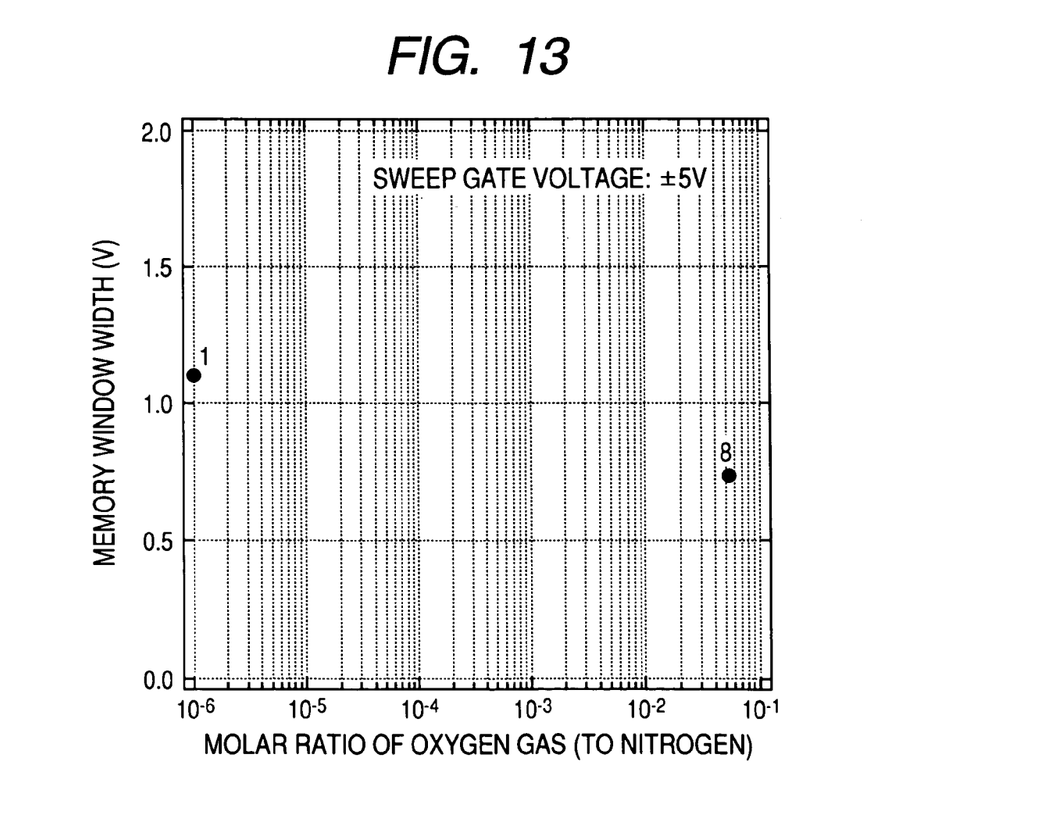
FIG. 13 is a drawing showing the relationship between the molar proportion of oxygen (to nitrogen) and memory window width in Examples 1 and 8.

A transistor of Example 8 was produced under completely the same conditions as in Example 1, except for the molar ratio of introduction oxygen gas to nitrogen gas. Namely, in this Example, the N:O in the introduction gas was 1:0.053. The gate voltage was swept and the drain current was measured to determine the memory window width of the MFIS transistor. The sweep gate voltage was conducted under the same conditions of ±5 V. The results thereof are shown in FIG. 13 together with the results in Example 1. The numerals in FIG. 13 correspond to the Example numbers.

EXAMPLE 9

The materials used and the thicknesses thereof are as follows.

Semiconductor substrate 1: Si

Insulator buffer layer 2: Hf$_{1-x}$Al$_{2x}$O$_{2+x+y}$; x=0.25; y=0; thickness of 10 nm Ferroelectric film 3: SrBi$_2$Ta$_2$O$_9$; thickness of 400 nm Gate electrode 4: Pt; thickness of 180 nm; gate length (length of distance from source region to drain region) of 10 μm Conductivity type of source region 5 and drain region 6: n-type Conductivity type of region 7: p-type The silicon was subjected to a surface treatment in which the oxide layer remaining on the surface thereof was removed with buffered hydrofluoric acid, and a nitride film was thereafter formed with an rf plasma source. Namely, nitrogen gas was supplied at a rate of 1.5 cc/min to an rf plasma source attached to a vacuum vessel for pulsed-laser deposition and a nitrogen plasma was generated under the conditions of an rf output of 200 W to form a silicon nitride film having a thickness of 1 nm on the silicon surface. The irradiation period with a nitrogen plasma beam was 10 minutes, and the temperature of the silicon substrate was 200° C. during the irradiation period. Hf$_{1-x}$Al$_{2x}$O$_{2+x+y}$ (x=0.25; y=0) as an insulator buffer layer 2 was formed by pulsed-laser deposition. The laser used was a KrF excimer laser. The laser energy was 250 mJ per pulse, the pulse repetition frequency was 2 Hz, and the deposition time was 270 seconds. The temperature of the substrate was 200° C. The introduction gas was nitrogen gas. The pressure of this introduction gas in the deposition chamber was 0.1 Torr (13.33 Pa). SrBi$_2$Ta$_2$O$_9$ corresponding to a ferroelectric film 3 was also formed by pulsed-laser deposition. The kind and energy of the laser were the same as in the case of the insulator buffer layer 2 described above. The pulse repetition frequency was 5 Hz and the deposition time was 27 minutes. The temperature of the substrate was 400° C. The introduction gas was oxygen. The pressure of this introduction gas in the deposition chamber was 0.1 Torr (13.33 Pa). Platinum was fprmed as a gate electrode 4 by electron-beam vacuum deposition. After the formation of the gate electrode, a heat treatment was conducted at 800° C. in oxygen at atmospheric pressure for 1 hour in order to crystallize the $SrBi_2Ta_2O_9$. A transistor was produced by using techniques for use in semiconductor device production steps, such as photolithography and ion beam etching.

Figure 14:
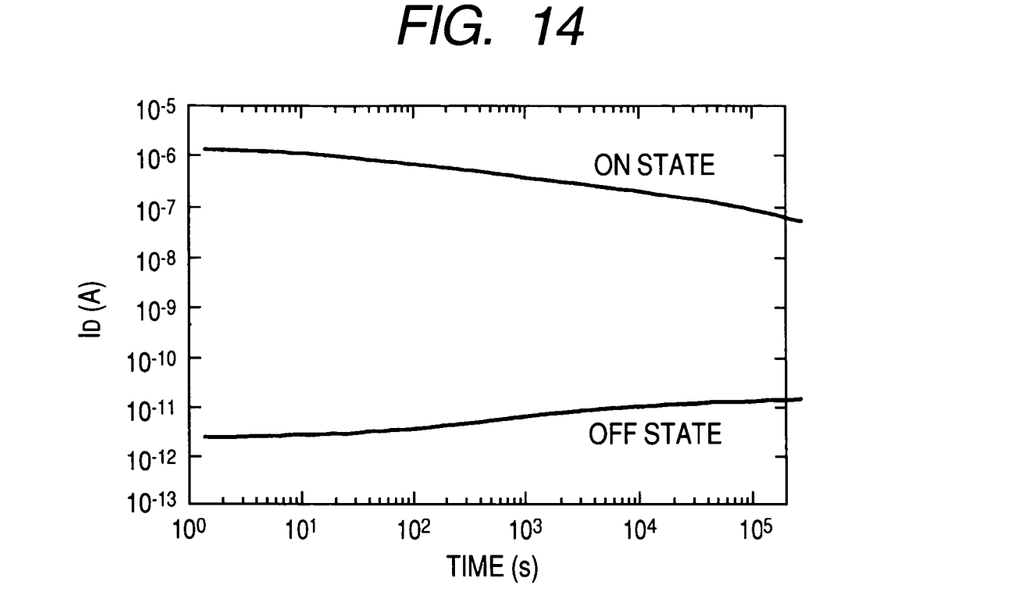
FIG. 14 is a drawing showing changes of drain current with time in the transistor according to Example 9.

A gate voltage $V_G$ of 8 V was applied to the transistor produced in Example 9, and the $V_G$ was then returned to 0.2 V to form an ON state. This state in which $V_G$=0.2 V was maintained and the drain current in the ON state was measured as a function of time. Furthermore, a gate voltage $V_G$ of –8 V was applied thereto and the $V_G$ was then returned to 0.2 V to form an OFF state. This state in which $V_G$=0.2 V was maintained and the drain current in the OFF state was measured as a function of time. The results of those are shown in FIG. 14.

EXAMPLE 10

The materials used and the thicknesses thereof are as follows.

Semiconductor substrate 1: Si

Insulator buffer layer 2: $Hf_{1-x}Al_{2x}O_{2+x+y}$; x=0.25; y=0; thickness of 10 nm Ferroelectric film 3: $SrBi_2Ta_2O_9$; thickness of 400 nm Gate electrode 4: Pt; thickness of 200 nm; gate length (length of distance from source region to drain region) of 10 μm Conductivity type of source region 5 and drain region 6: n-type Conductivity type of region 7: p-type $HfO_2$ and $Al_2O_3$ were separately prepared as target materials for pulsed-laser deposition to form $Hf_{1-x}Al_{2x}O_{2+x+y}$ (x=0.25; y=0) as an insulator buffer layer 2 by pulsed-laser deposition. The laser used was a KrF excimer laser. The laser energy was 250 mJ per pulse and the pulse repetition frequency was 2 Hz. $HfO_2$ was first deposited for 202 seconds and $Al_2O_3$ was then deposited for 68 seconds. The temperature of the substrate was 200° C. The introduction gas was nitrogen gas. The pressure of this introduction gas in the deposition chamber was 0.1 Torr (13.33 Pa). $SrBi_2Ta_2O_9$ corresponding to a ferroelectric film 3 was also formed by pulsed-laser deposition. The kind and energy of the laser were the same as in the case of the insulator buffer layer 2 described above. The pulse repetition frequency was 5 Hz and the deposition time was 34 minutes. The temperature of the substrate was 400° C. The introduction gas was oxygen. The pressure of this introduction gas in the deposition chamber was 0.1 Torr (13.33 Pa). Platinum was formed as a gate electrode 4 by electron-beam vacuum deposition. After the formation of the gate electrode, a heat treatment was conducted at 800° C. in oxygen at atmospheric pressure for 1 hour in order to crystallize the $SrBi_2Ta_2O_9$. A transistor was produced by using techniques for use in semiconductor device production steps, such as photolithography and ion beam etching.

Figure 15:
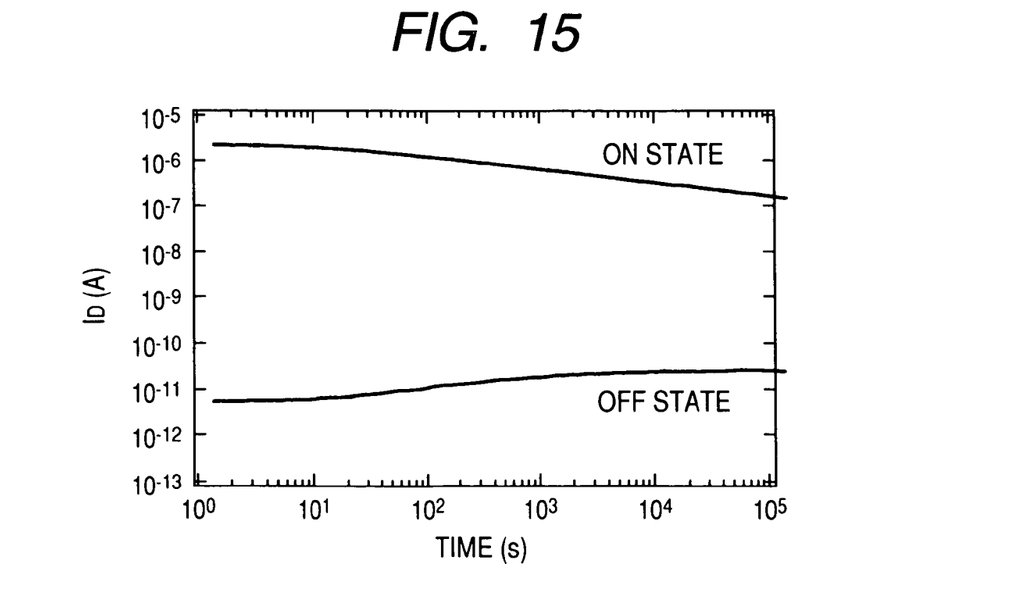
FIG. 15 is a drawing showing changes of drain current with time in the transistor according to Example 10.

A gate voltage $V_G$ of 6 V was applied to the transistor produced in Example 10, and the $V_G$ was then returned to 0.9 V to form an ON state. This state in which $V_G$=0.9 V was maintained and the drain current in the ON state was measured as a function of time. Furthermore, a gate voltage $V_G$ of –6 V was applied thereto and the $V_G$ was then returned to 0.9 V to form an OFF state. This state in which $V_G$=0.9 V was maintained and the drain current in the OFF state was measured as a function of time. The results of those are shown in FIG. 15.

The invention claimed is:

1. A semiconductor-ferroelectric storage device, which comprises a metal-ferroelectric-insulator-semiconductor (MFIS) transistor comprising a semiconductor substrate or semiconductor region having a source region and a drain region and, on which an insulator buffer layer, a ferroelectric film, and a gate electrode are layered in this order, wherein the insulator buffer layer is an insulating film comprising a hafnium-aluminum oxide as a main component, a ratio among said hafnium element and said aluminum element in the insulator buffer layer being $Hf_{1-x}:Al_{2x}$, wherein constitution ratio x is within 0<x<0.7.

2. The semiconductor-ferroelectric storage device according to claim 1, wherein the insulator buffer layer contains a nitrogen element as an additive.

3. The semiconductor-ferroelectric storage device according to claim 2, wherein the nitrogen element is contained in an amount of from $1\times10^{19}$ cm$^{-3}$ to $1\times10^{22}$ cm$^{-3}$.

4. The semiconductor-ferroelectric storage device according to claim 1, wherein an oxide film, a nitride film, or an oxynitride film is inserted between the semiconductor substrate or semiconductor region and the insulator buffer layer.

5. A semiconductor-ferroelectric storage device, which comprises a metal-ferroelectric-insulator-semiconductor (MFIS) transistor comprising a semiconductor substrate or semiconductor region having a source region and a drain region and, on which an insulator buffer layer, a ferroelectric film, and a gate electrode are layered in this order, wherein the insulator buffer layer is an insulating film comprising a hafnium oxide or a hafnium-aluminum oxide as a main component and contains a nitrogen element as an additive.

6. The semiconductor-ferroelectric storage device according to claim 5, wherein the nitrogen element is contained in an amount of from $1\times10^{19}$ cm$^{-3}$ to $1\times10^{22}$ cm$^{-3}$.

7. The semiconductor-ferroelectric storage device according to claim 5, wherein an oxide film, a nitride film, or an oxynitride film is inserted between the semiconductor substrate or semiconductor region and the insulator buffer layer.

8. A process for producing a semiconductor-ferroelectric storage device, which comprises a metal-ferroelectric-insulator-semiconductor (MFIS) transistor comprising a semiconductor substrate or semiconductor region having a source region and a drain region and, on which an insulator buffer layer comprising a hafnium-aluminum oxide as a main component, a ratio among said hafnium element and said aluminum element in the insulator buffer layer being $Hf_{1-x}:Al_{2x}$, wherein constitution ratio x is within 0<x<0.7, a ferroelectric film, and a gate electrode are layered in this order, said process comprising a treatment of a semiconductor surface, a formation of the insulator buffer layer, a formation of the ferroelectric film, a formation of the gate electrode, and a heat treatment.

9. The process for producing a semiconductor-ferroelectric storage device according to claim 8, wherein the formation of the insulator buffer layer is conducted in an atmosphere comprising nitrogen gas.

10. The process for producing a semiconductor-ferroelectric storage device according to claim 9, wherein the atmosphere comprising nitrogen gas is a mixed-gas atmosphere comprising nitrogen and oxygen in a molar ratio of from 1:1 to 1:$10^{-7}$.

11. The process for producing a semiconductor-ferroelectric storage device according to claim 8, wherein a substrate is placed in a vacuum vessel for thin-film formation, and the insulator buffer layer and the ferroelectric film are successively formed by vapor deposition without taking the substrate out of the vessel.

12. The process for producing a semiconductor-ferroelectric storage device according to claim 8, wherein a substrate is placed in a vacuum vessel for thin-film formation, and the insulator buffer layer and the ferroelectric film are successively formed by pulsed-laser deposition without taking the substrate out of the vessel.

13. The process for producing a semiconductor-ferroelectric storage device according to claim 12, wherein hafnium and aluminum are supplied from separate sources.

14. The process for producing a semiconductor-ferroelectric storage device according to claim 8, wherein hafnium and aluminum are simultaneously supplied to form the insulator buffer layer by vapor deposition.

15. The process for producing a semiconductor-ferroelectric storage device according to claim 8, wherein hafnium and aluminum are each alternately supplied at least one time to form the insulator buffer layer by vapor deposition.

16. The process for producing a semiconductor-ferroelectric storage device according to claim 15, wherein the hafnium is supplied first.

17. The process for producing a semiconductor-ferroelectric storage device according to claim 8, wherein the heat treatment is conducted at least one time in any timing and environment selected from: in a vacuum vessel for ferroelectric-film formation during the formation of the ferroelectric film; in a vacuum vessel for ferroelectric-film formation after the formation of the ferroelectric film; in an annealing furnace after the formation of the ferroelectric film and before the formation of the gate electrode; and in an annealing furnace after the formation of the gate electrode.

18. A process for producing a semiconductor-ferroelectric storage device, which comprises a metal-ferroelectric-insulator-semiconductor (MFIS) transistor comprising a semiconductor substrate or semiconductor region having a source region and a drain region and, on which an insulator buffer layer comprising a hafnium oxide or a hafnium-aluminum oxide as a main component, a ferroelectric film, and a gate electrode are layered in this order, said process comprising a treatment of a semiconductor surface, a formation of the insulator buffer layer, a formation of the ferroelectric film, a formation of the gate electrode, and a heat treatment, wherein the formation of the insulator buffer layer is conducted in an atmosphere comprising nitrogen gas.

19. The process for producing a semiconductor-ferroelectric storage device according to claim 18, wherein the atmosphere comprising nitrogen gas is a mixed-gas atmosphere comprising nitrogen and oxygen in a molar ratio of from 1:1 to $1:10^{-7}$.

20. The process for producing a semiconductor-ferroelectric storage device according to claim 18, wherein a substrate is placed in a vacuum vessel for thin-film formation, and the insulator buffer layer and the ferroelectric film are successively formed by vapor deposition without taking the substrate out of the vessel.

21. The process for producing a semiconductor-ferroelectric storage device according to claim 18, wherein a substrate is placed in a vacuum vessel for thin-film formation, and the insulator buffer layer and the ferroelectric film are successively formed by pulsed-laser deposition without taking the substrate out of the vessel.

22. The process for producing a semiconductor-ferroelectric storage device according to claim 18, wherein the heat treatment is conducted at least one time in any timing and environment selected from: in a vacuum vessel for ferroelectric-flim formation during the formation of the ferroelectric film; in a vacuum vessel for ferroelectric-film formation after the formation of the ferroelectric film; in an annealing furnace after the formation of the ferroelectric film and before the formation of the gate electrode; and in an annealing furnace after the formation of the gate electrode.

* * * * *